(12) United States Patent
Briggs

(10) Patent No.: US 7,945,827 B1
(45) Date of Patent: May 17, 2011

(54) METHOD AND DEVICE FOR SCAN CHAIN MANAGEMENT OF DIES REUSED IN A MULTI-CHIP PACKAGE

(75) Inventor: Randall D. Briggs, Boise, ID (US)

(73) Assignee: Marvell International Technology Ltd., Hamilton (BM)

( * ) Notice: Subject to any disclaimer, the term of this patent is extended or adjusted under 35 U.S.C. 154(b) by 634 days.

(21) Appl. No.: 11/986,529

(22) Filed: Nov. 20, 2007

Related U.S. Application Data

(60) Provisional application No. 60/882,335, filed on Dec. 28, 2006.

(51) Int. Cl.
*G01R 31/28* (2006.01)

(52) U.S. Cl. ............................ 714/724; 710/1; 326/16

(58) Field of Classification Search .................. 714/718; 326/16; 710/1
See application file for complete search history.

(56) References Cited

U.S. PATENT DOCUMENTS

| | | | | |
|---|---|---|---|---|
| 4,905,075 A | * | 2/1990 | Temple et al. ................ | 257/680 |
| 5,706,232 A | * | 1/1998 | McClure et al. .............. | 365/201 |
| 6,301,182 B1 | * | 10/2001 | Tanaka .......................... | 365/221 |
| 6,407,613 B1 | * | 6/2002 | Jaynes et al. .................. | 327/415 |
| 6,686,759 B1 | * | 2/2004 | Swamy ......................... | 324/765 |
| 7,134,059 B2 | * | 11/2006 | Jeon .............................. | 714/718 |
| 7,299,389 B2 | * | 11/2007 | Nishida et al. ................ | 714/724 |
| 2003/0115528 A1 | * | 6/2003 | Tanaka et al. ................. | 714/742 |
| 2005/0055618 A1 | * | 3/2005 | Finteis et al. ................. | 714/742 |
| 2008/0052573 A1 | * | 2/2008 | Pekny ........................... | 714/724 |
| 2009/0309609 A1 | * | 12/2009 | De Jong et al. ............... | 324/537 |

* cited by examiner

*Primary Examiner* — Robert Beausoliel
*Assistant Examiner* — Steve Nguyen

(57) ABSTRACT

An apparatus and method for economical testing of dies in a multichip module. Internal I/O pins on a die are logically connected to external I/O pins of the multichip module through the use of a silicon interposer on which the dies are attached. Multiplexers on the interposer can select between the external pins of the multichip module and the internal pins of the dies. The silicon interposer can be economically manufactured using manufacturing technology having relatively a large feature size, such as is found in a relatively mature IC fabrication plant. Further, use of the present invention allows multichip modules to be tested for faults without the necessity of redesigning test circuitry or adding additional pins to the package.

23 Claims, 7 Drawing Sheets

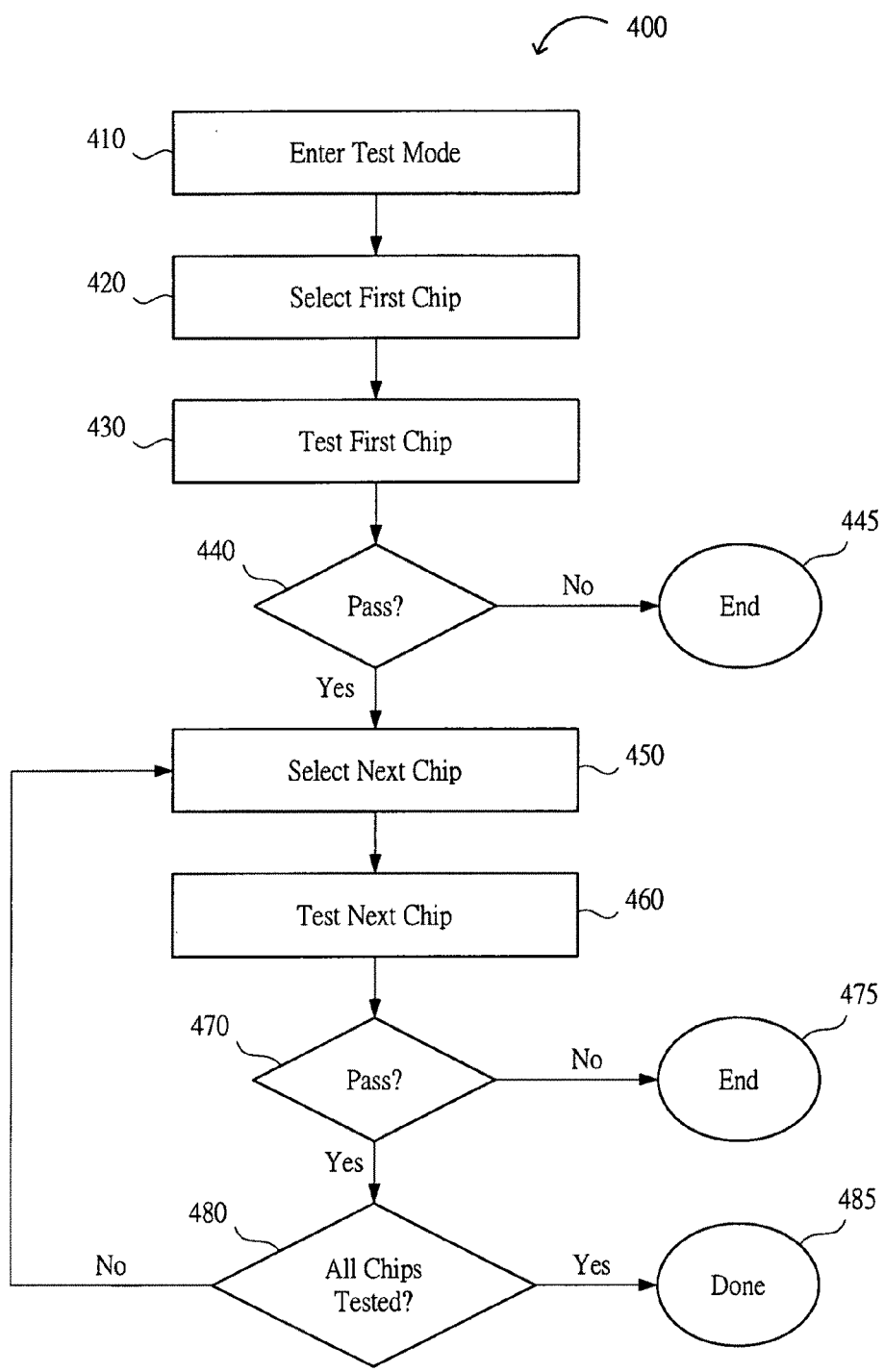

US 7,945,827 B1

METHOD AND DEVICE FOR SCAN CHAIN MANAGEMENT OF DIES REUSED IN A MULTI-CHIP PACKAGE

RELATED APPLICATIONS

This application claims the benefit of U.S. Provisional Application No. 60/882,335, filed Dec. 28, 2006, and incorporated herein by reference in its entirety.

FIELD OF THE INVENTION

The present invention generally relates to the field of testing an integrated circuit (IC). More specifically, embodiments of the present invention pertain to circuits, systems, and methods for testing an IC in a packaged multichip module, such as a System-In-Package (SIP), and in particular scan chain testing of the same.

DISCUSSION OF THE BACKGROUND

Integrated circuits may be housed in a plurality of chip packages. A Multi-Chip Module (MCM) is a chip package that contains two or more dies mounted close together on a substrate base. The short traces between the chips can increase performance relative to individually packaged chips, such as by reducing noise that external traces between individual chip packages can produce, thereby allowing higher frequency of operation, and by allowing CMOS and bipolar technologies to be used in the same package. A form of MCM is a System-In-Package (SIP), which includes a single package, housing a multi-die semiconductor system. The terms "MCM" and "SIP" are used here interchangeably throughout. A SIP with multiple dies can replace part or all of a printed circuit board (PCB), and can include a variety of chip packages.

Integrated circuit chips are tested during various stages of manufacture with production tests. One such test is a final test on a packaged die. In a scan-design test, the chip or die, which has been designed in accordance with so-called design for test (DFT) techniques or principles prior to manufacture, has test data inputs applied to the die placed under test mode, and outputs are observed and compared to predicted results. Registers (flip-flops) in the design are connected in one or more scan chains, which are used to gain access to internal nodes of the chip. Test patterns are shifted into the chip(s) via the scan chain(s) during a serial phase, followed by a parallel phase where the clock signal is pulsed one or more times to test the circuit. The results of the test are captured in the flip-flops and are then shifted out to the die output pins and compared against predicted results. Variance between actual output and predicted output indicates a failure.

Scan chains are thus used in chips designed for test. In scan chain enabled chips, a special signal called scan enable is added to the chip. When a scan enable signal is asserted, every flip-flop in the scan chain is effectively connected into a long shift register, with one input pin providing the data to the scan chain, and one output pin providing the output of the scan chain. A specific data pattern may be entered into the chain of flip-flops. The data pattern sets the internal state of the chip into a desired state to test certain features. The clock is pulsed one or more times to exercise the chip, and the state of every flip-flop may be read to observe the outcome of the test by shifting out the scan chain. In a full scan design, all flip-flops are included in a scan chain. Other variants include a partial scan, where only some of the flip-flops are connected into a chain; multiple scan chains, where two or more scan chains are built in parallel, to reduce the time to load and observe test data; and test compression, where the input to the scan chain is driven by on-board logic that decompresses the input received. Further, various test algorithms may be used to efficiently test a large IC in a given fixed period of time using test vectors, and often using specialized equipment and design tools, such as automatic test-pattern generation (ATPG) and automatic test-vector generation (ATVG) electronic design automation tools. In addition, chips that are designed for test may be designed with Built-In Self Test (BIST) logic, to obviate the need for external test signals. However, the results of such BIST tests have to be accessed, controlled and observed through external pins.

Referring now to FIG. 1, there is shown a representative scan chain 100 of the kind used in a chip internal scan test. A plurality of clocked flip-flops 112, 114, shown as D-type flip-flops, are linked together in a daisy chain fashion inside a chip to form a serial shift register 100, called a scan chain. A plurality of these scan chains may exist within a chip.

As shown in FIG. 1, the input to each flip-flop is multiplexed, so that the D input is chosen from either the scan chain output from the previous flip-flop or the normal input. First D-type flip-flop 112 receives a signal from either normal input 116 or the output 118 from the previous flip-flop, D-type flip-flop 114 daisy chained in series, and acting through mux 120. Similarly, D-type flip-flop 114 receives a signal controlled by mux 121 from either its normal input 122 or the output 124 from a previous flip-flop (not shown) that forms part of the serial shift register scan chain 100. Output 126 from the D-type flip-flop 112 may likewise be connected in a daisy chain fashion to another flip-flop (not shown) in the same manner flip-flop 114 is connected to flip-flop 112. D flip-flops 112, 114 may be synchronous (or clocked) flip-flops, each having a clock signal line CLK as shown.

When flip-flops 112, 114 are connected in the manner shown in FIG. 1, the scan chain is called a muxed scan. Operation of the muxed scan is as follows. Predetermined patterns are shifted through the scan chains. These patterns can be of any number of patterns, such as, by way of illustration and not limitation, stuck at fault models; test vectors of any kind, such as pseudorandom test vectors, generated by pseudorandom test generation or any other kind of test pattern.

When performing scan testing of an IC die through the scan chain methodology as illustrated in FIG. 1, the IC is placed into a test mode through control signals, whereby several of the pad inputs to the IC become inputs to scan chains, such as scan chain 100, and several of the pad outputs of the IC become scan outputs. Additionally, the muxes 120, 121 can be controlled so that they either allow input data to pass normally to the D flip-flops 112, 114, or to shift out data serially so the D flip-flops receive data from their neighboring flip-flops, in a daisy chain fashion. Once placed into test mode, the muxes are set to select the data from the prior flip-flop of the scan chain. The scan chains are loaded with a test pattern by applying the test pattern serially to the pad inputs while strobing the CLK signal. Once the test patterns are loaded into the scan chains, the muxes are set to select the normal input. The CLK signal is strobed one or more times to propagate the signals from the flip-flops, through the combinatorial logic of the chip, into the inputs of flip-flops that are on scan chain. The muxes are then set to once again connect the scan chain.

Upon the application of a suitable number of control signals and clock pulses, the scan chains are scanned out at their normal Q output (e.g., outputs 118, 126 of D flip-flops 112, 114), and the data shifted out of each flip-flop is compared to expected data. A variance between expected data and received output data indicates the presence of manufacturing faults within the IC. For example, no signal received in one flip-flop from a neighboring flip-flop might indicate an open circuit somewhere in the interconnect in-between the two flip-flops.

A tenet in IC testing is controllability and observability through the use of external pins on a chip. Test controllability refers to the ability to apply a desired test stimulus at the input of the die. Test controllability also refers to activating or deactivating logic blocks internal to the IC for testing, such as through a scan enable signal, or activating a BIST. Test observability refers to the ability to observe and evaluate the results of the IC test. For scan testing, test observability means that the output of the scan chains can be observed. It should be understood that testing of an IC may include other kinds of tests than the above tests, as is known in the art.

In all tests of a complex IC, a reoccurring problem is the number of pins needed to execute the tests. Two factors exacerbate the problem of sufficient pins for scan-testing complex ICs. First, since complex ICs have many cells, megacells and embedded blocks of logic, a large number of logic elements must be tested. It is desirable to have a large number of scan chains to reduce the test time. However, a relatively large number of scan chains generally requires a large number of pins. Secondly, as ICs encompass whole electronic systems, the number of functional pins may actually decrease, as most of the interconnects previously found between ICs are absorbed into the single complex IC.

Scan testing multiple dies in a package such as a SIP can create problems, such as creating hidden scan chains that are not externally controllable or observable. Many input/output (I/O) signals of the dies in a SIP package are no longer available once these dies are incorporated into the SIP package. Instead, the dies are connected to their destination within the SIP itself using internal pins, hidden from external view and without being exposed to external access and control through SIP package external pins. These internal hidden connections no longer provide a means of functioning as the scan-in head or scan-out tail of the scan chains, such as scan chain 100 in FIG. 1. Further, once the dies are assembled in the SIP package, there is no easy, non-destructive way of testing the SIP package dies individually without using separate I/O pins for each device.

The above problems may be solved by less advantageous solutions than proposed by the present invention. For example, some or all dies in a SIP package may be redesigned to have fewer scan chains, and/or the scan chains may be relocated to signals which are connected to pins in the SIP package so that they can receive and transmit external signals. In other words, in the latter solution, if internal scan chains are present that are hidden from external view, one may make these hidden scan chains less hidden and accessible to external view by moving them to external pins. Another less advantageous alternative solution to the present invention would be to increase the pin count of the SIP package to provide access to all scan chains. However, it may not be practical or possible to increase the pin count. In any case, these less advantageous solutions add cost to the SIP package and/or are relatively time consuming; for example, it can take months to redesign dies and/or the SIP package in this way.

Therefore, it is desirable to provide a method and device for scan chain management of dies in a SIP or MCM package that overcomes problems relating to scan chain testing of existing dies in a SIP package, as well as to provide other advantages as disclosed in the specification and claims herein.

SUMMARY OF THE INVENTION

Embodiments of the present invention relate to the field of scan chain testing of an integrated circuit (IC). More specifically, embodiments of the present invention pertain to an apparatus (circuit and/or architecture) and methods for scan testing of ICs (dies) in a MCM or System-In-Package (SIP).

In one aspect, the present invention comprises a multichip module, comprising a silicon interposer and first and second dies operatively connected thereto. The interposer has logic thereon configured to select any one of the dies for receiving one or more external test signals and transmitting one or more test result signals for external communication. Each die has a plurality of input and/or output (I/O) terminals configured to communicate with the logic, and has test circuitry for testing the die with at least one the test signal. The multichip module also comprises a package, housing the first and second dies and covering the silicon interposer. Such testing may comprise a full-scan test, a partial scan test, a built-in self test (BIST), an IC functional test, and/or a direct test.

The logic generally comprises a plurality of multiplexers, where at least a first subset of the multiplexers receives an output from a first subset of the first plurality of I/O terminals and at least one first external input signal, a second subset of the multiplexers receives an output from a first subset of the second plurality of I/O terminals and at least one second external input signal, and a third subset of the multiplexers receives outputs from a second subset of the first plurality of I/O terminals and a second subset of the second plurality of I/O terminals.

The logic generally comprises a plurality of multiplexers, at least a first subset of the multiplexers receiving an output from a first subset of the first plurality of I/O terminals and at least one first external input signal, a second subset of the multiplexers receiving an output from a first subset of the second plurality of I/O terminals and at least one second external input signal, and a third subset of the multiplexers receiving outputs from a second subset of the first plurality of I/O terminals and a second subset of the second plurality of I/O terminals. The silicon interposer generally has one or more metal layers operatively connecting the pins of the first and second dies to the multiplexers. The interposer may also further comprise a plurality of pass gates, each configured to bypass one of the plurality of multiplexers after testing is complete.

The logic may further comprise a mode select circuit configured to control the multiplexers. The mode select circuit may receive a test mode signal that causes one of the first and second subsets of multiplexers to select one or more external inputs on the interposer. The test mode signal may also cause the third subset of the multiplexers to select outputs from one of the first die and the second die as an external output signal.

The mode select circuit may further receive one or more chip select signals configured to select the first die or the second die for testing. A predetermined state of the chip select signal(s) may configure either the first or second subset of multiplexers to select the at least one external input signal for test purposes, and/or the third subset of multiplexers to select outputs from the second subset of the first or second plurality of I/O terminals.

In various embodiments, the multichip module comprises a plurality of wire bonds or ball bonds independently between each of the first and second dies and the interposer. The package may be selected from the group consisting of BGA and QFP packages. Advantageously, each of the first and second dies has a minimum feature size that is smaller than a minimum feature size of the interposer.

The present invention also relates to a method of testing one of a plurality of dies in a multichip module, where the dies are operatively connected to one another through a silicon interposer in the multichip module. The method of testing generally comprises entering a test mode and selecting a first one of the plurality of dies for receiving a first test signal and for transmitting a first test result; providing the first test signal to the selected die using a first plurality of external input and/or output (I/O) terminals of the multichip module; obtaining the first test result from the selected die using a second plurality of external I/O terminals of the multichip module, each of the second plurality of external I/O terminals being the same as or different from one of the first plurality of external I/O terminals; exiting the test mode; and receiving or transmitting non-test signals on the first and second pluralities of external I/O terminals. The method generally further comprises selecting a second one of the plurality of dies for receiving a second test signal and for transmitting a second test result; providing the second test signal to the second selected die using the first plurality of external I/O terminals; and obtaining the second test result from the second selected die using the second plurality of external I/O terminals. Generally, the second test signal is provided to and the second test result is obtained from the second selected die while in the test mode. The method may further comprise determining whether the first test result matches an expected test result prior to selecting the second die.

The test vector may be selected from the group consisting of a full-scan vector, a partial scan vector, an IC functional test vector, a direct test vector, a BIST vector, DFT self-test vector, and a test vector generated by Automatic Test Equipment. In the method of testing, entering the test mode may comprise receiving a predetermined state of a test mode control signal, and selecting the first die may comprise receiving a predetermined state of a chip select signal. Once testing is completed, the method may further comprise bypassing the multiplexers.

The present invention also relates to a method of making a multichip module, comprising forming a silicon interposer having logic thereon configured to select any one of a plurality of dies for receiving one or more test signals and transmitting one or more test results using first and second pluralities of input and/or output (I/O) terminals on the silicon interposer; operatively attaching a first die to the first plurality of I/O terminals, the first die having test circuitry for testing the first die with at least a first one of the test signals; operatively attaching a second die to the second plurality of I/O terminals, the second die having test circuitry for testing the second die with at least a second one of the external test signals; and packaging the first and second dies and the silicon interposer. The method of making may further comprise forming the logic using at least a polysilicon layer on the silicon interposer; and forming an interconnect on the silicon interposer, configured to connect the first and second pluralities of I/O terminals to the logic.

As for the other aspects of the present invention, the logic may comprise a plurality of multiplexers. In the present method, the plurality of multiplexers may comprise a first subset of the multiplexers connected to a first subset of the first plurality of I/O terminals, a second subset of the multiplexers connected to a first subset of the second plurality of I/O terminals, and a third subset of the multiplexers connected to a second subset of the first plurality of I/O terminals and a second subset of the second plurality of I/O terminals, each of the second subsets of I/O terminals being the same as or different from the first plurality of I/O terminals.

In addition, the method of making may further comprise designing the first and second dies according to design for test (DFT) principles and/or techniques. Also, operatively connecting the first and/or second die may independently comprise forming a first plurality of wire bonds or ball bonds between the first or second die and the interposer, and packaging the first and second dies and the silicon interposer may comprise housing the first and second dies and the silicon interposer in a package selected from the group consisting of BGA and QFP packages.

Advantageously, in the multichip module, the minimum feature size of the dies is smaller than the minimum feature size of the silicon interposer. For example, the silicon interposer may be manufactured with process technology having minimum design rules or critical dimensions of greater than or equal to 0.5 μm (micron) process technology, whereas the dies may be manufactured with process technology having minimum design rules or critical dimensions of less than or equal to 0.35 μm (microns).

In various embodiments, the dies may comprise DFT dies, the dies may be scan chain enabled, and/or the test circuitry is selected from the group of tests consisting of full-scan, partial scan, an IC functional, direct, BIST, or DFT self-test circuitry. However, it should be stressed that any particular test is possible, given the circuit architecture of the SIP as taught herein, and the present invention is not limited to any particular test or set of tests.

The present invention advantageously provides for routing of scan chain connections using a silicon interposer having logic thereon (e.g., multiplexers) to take full advantage of all external input and/or output terminals or pin connections (e.g., use a number of such I/O terminals dual purposes, such as for testing and for data, depending on the state of certain external control signals, such as test mode and chip select control signal[s]). These and other advantages of the present invention will become readily apparent from the detailed description of preferred embodiments below.

BRIEF DESCRIPTION OF THE DRAWINGS

FIG. 4 is a flow chart of an exemplary method of the present invention.

DETAILED DESCRIPTION OF THE PREFERRED EMBODIMENTS

Figure 1:
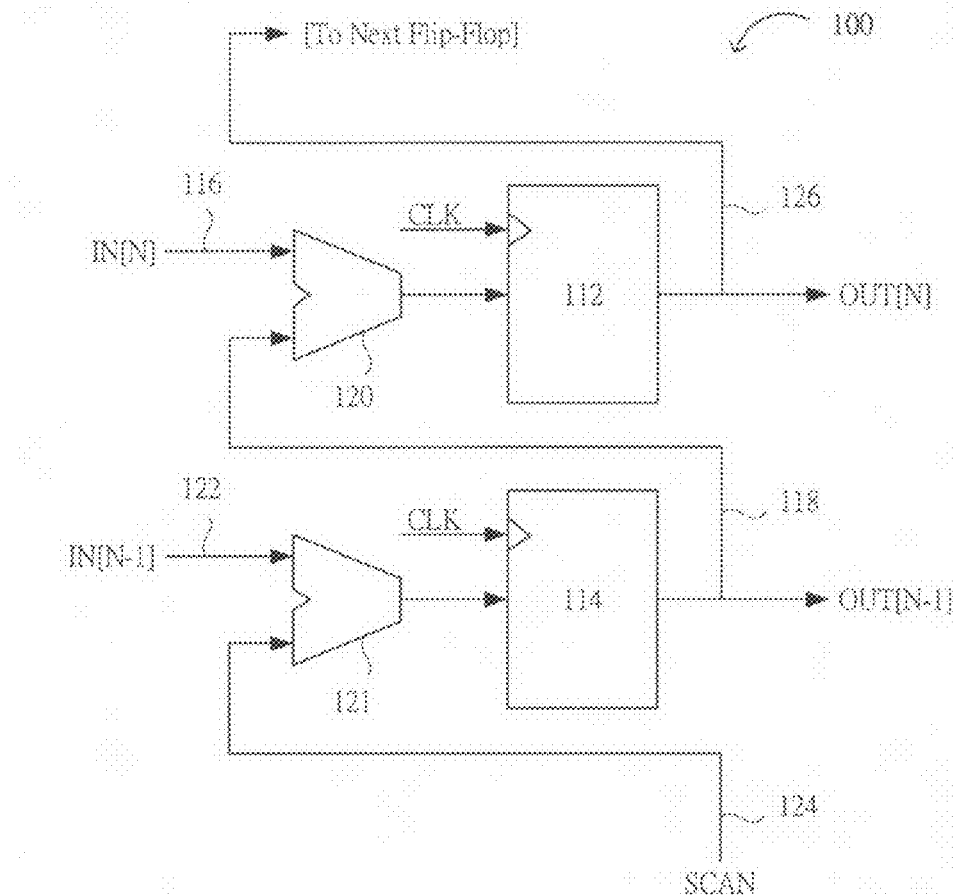
FIG. 1 is a diagram showing a conventional scan chain methodology circuit for scan chain testing.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, and other symbolic representations of operations on data bits, data streams, vectors or waveforms within a computer, processor, controller, and/or memory. These descriptions and representations are generally used by those skilled in the data processing arts to effectively convey the substance of their work to others skilled in the art. A process, procedure, logic block, functional blocks, operation, etc., is herein, and is generally, considered to be a self-consistent sequence of steps or instructions leading to a desired and/or expected result. The steps generally include physical manipulations of physical quantities.

It should be borne in mind, however, that all of these and similar terms are associated with the appropriate physical quantities and are merely convenient labels applied to these quantities. Furthermore, for the sake of convenience and simplicity, the terms "clock," "time," "rate," "period" and "frequency" are generally used interchangeably herein, but are generally given their art-recognized meanings. Also, for convenience and simplicity, the terms "data," "vector" and "information" may be used interchangeably, as may the terms "connected to," "coupled with," "coupled to," and "in communication with" (which terms also refer to direct and/or indirect relationships between the connected, coupled and/or communication elements unless the context of the term's use unambiguously indicates otherwise), but these terms are also generally given their art-recognized meanings.

The present invention uses a silicon interposer to provide multiplexed or other logical connections between different dies and between a die under test and different external I/O terminals in a SIP package. The silicon interposer takes advantage of the available external input and/or output pins of the entire SIP package to more advantageously test each die housed in the SIP package, without having to relocate the pins or redesign any test logic within the dies.

An MCM or SIP of the present invention includes but is not limited to a microprocessor, memory, including memory such as static RAM (SRAM), dynamic RAM (DRAM), and flash memory, and other integrated circuitry such as an application specific integrated circuit (ASIC). The SIP with multiple dies can replace an entire printed circuit board (PCB), which formerly comprised individually packaged dies mounted on the PCB. Typical SIP packages include, but are not limited to, Ball Grid Array (BGA) and Quad Flat Pack (QFP) configurations. In general, a BGA is a surface mount chip package that has a grid or array of solder balls on its mounting surface as its connectors (e.g., I/O terminals or pins) to the interposer, while a QFP is generally a surface mount chip package that uses leads (e.g., wire bonds) to connect I/O terminals (e.g., bond pads) on the die to corresponding bond pads on the interposer.

Figure 2:
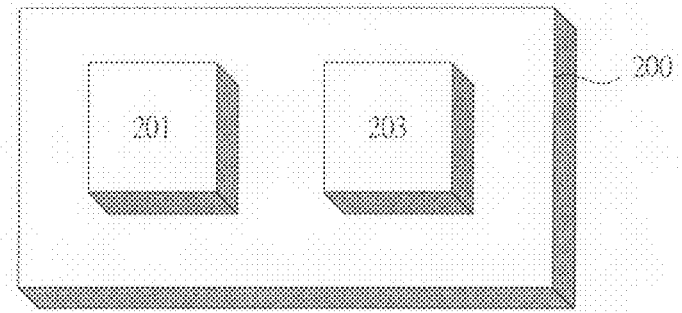
FIG. 2 is a diagram showing a conventional MCM or SIP including a silicon interposer to connect dies.

Referring now to FIG. 2, there is shown a silicon interposer 200, which generally comprises a silicon substrate for die to be placed on the silicon interposer. The silicon interposer 200 has at least one, and typically, several metal layers therein as interconnections between the die mounted on the interposer 200. The silicon interposer 200 has logic in it, configured to select any one of a plurality of dies thereon to receive one or more external test signals and transmit one or more test result signals to one or more external communication terminals. One reason the silicon interposer is used is that for multiple dies to be interconnected to one another, such as for example die 201 and die 203, it may be easier in some cases to use the silicon interposer 200, through which die 201 may be connected to die 203 via the metal interconnect layers of the silicon interposer 200, rather than by wire bonding the external bond pads of die 201 directly to the external bond pads of die 203 (e.g., when ball-bonding a wire to a bond pad on the first die 201, then connecting the other end of the wire to a bump on a bond pad of a second substrate, such as either the second die 203 or the interposer 200). Silicon interposers are also useful for Quad Flat Pack (QFP) die packages, since bond pads for wire bonding can be easily formed thereon. The present invention includes additional circuit logic in the silicon interposer, to allow testing of a die in a SIP package in a more economical fashion.

The invention, in its various aspects, will be explained in greater detail below with regard to exemplary embodiments.

Exemplary Circuits

Figure 3:
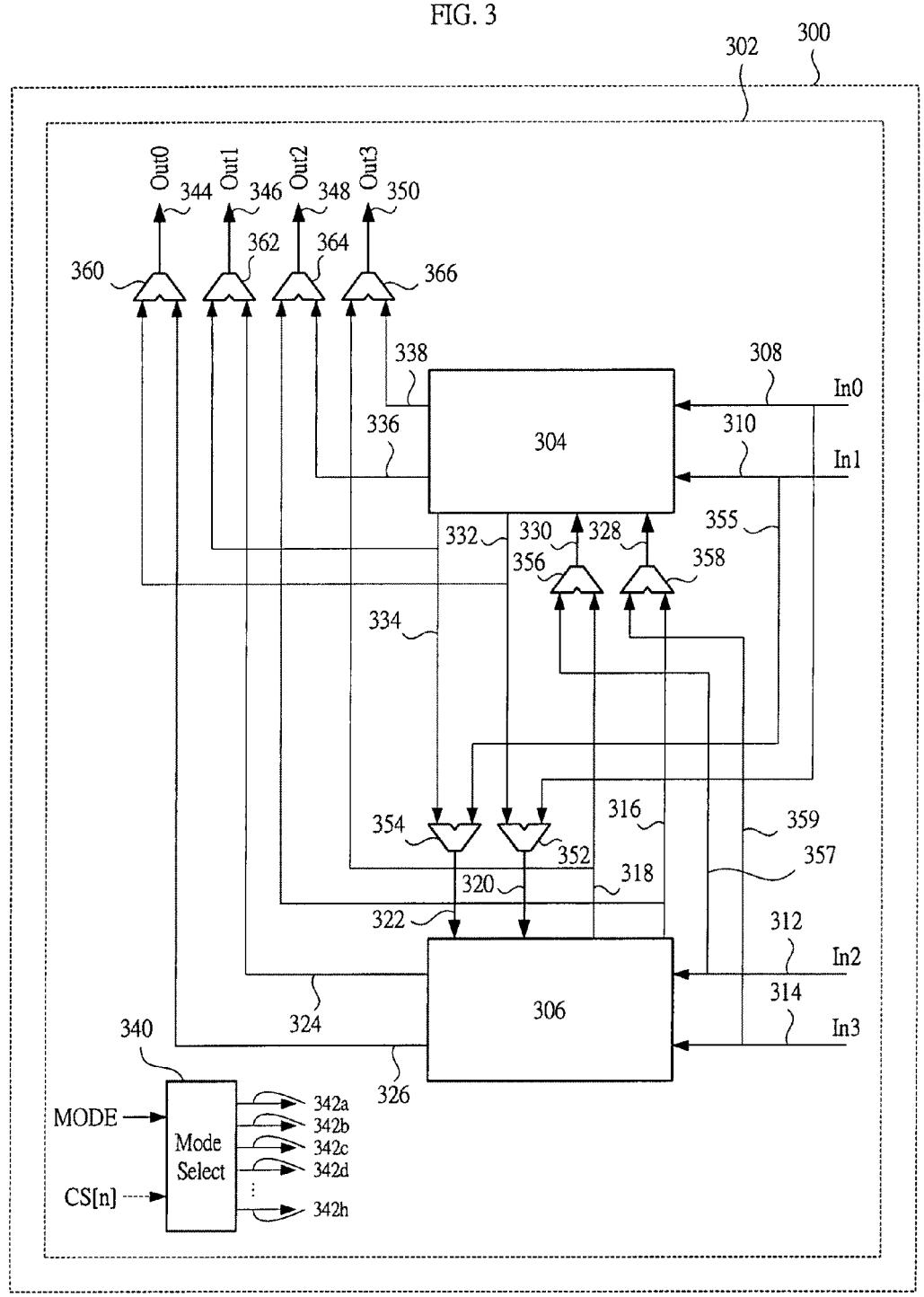
FIG. 3 is a diagram of an exemplary MCM or SIP in accordance with the present invention, including a silicon interposer having logic thereon to provide routing interconnects for scan testing of individual die.

FIG. 3 shows a simplified, exemplary diagram of the present MCM 300 including a silicon interposer 302 that includes routing interconnects for testing individual dies. The SIP package 300 may simply be a group or plurality of integrated circuits or dies enclosed, encased or housed in a single package and which are configured to communicate with at least one other die in the package. In various embodiments, the SIP package 300 may include any kind of package, including but not limited to BGA or QFP configurations. The dies (e.g., 304 and 306) in turn communicate with one another through a silicon interposer 302. The dies or chips 304 and 306 may be designed for test (DFT) and have suitable test circuitry thereon, e.g., enabled for scan chain testing. The silicon interposer 302 underlying the dies 304 and 306 comprises a silicon substrate with a plurality of bond pads thereon and at least one level of metallization thereon. Such an interposer is relatively easy and cheap to manufacture. The silicon interposer 302 has one or more metal layers, where the interconnect of the silicon interposer is located. The interconnect of the silicon interposer 302 connects the I/O terminals or pins of the dies 304, 306 to one another and/or to external terminals (e.g., bond pads, which may further have ball bonds thereon) on the interposer 302. The silicon interposer enables testing of the different dies using external pins or terminals that may also have another function or use, while also enabling the different dies to be operatively connected to one another.

In the embodiment of FIG. 3, during normal operating mode (e.g., non-test mode), some pins of the dies 304, 306 are external I/O pins (or I/O terminals), while other pins are internal I/O pins (or I/O terminals). For example, during normal operating mode, pins 308 and 310 are external input pins for die 304, and pins 312 and 314 are external input pins for die 306; pins 324 and 326 are external output pins for die 306, and pins 336 and 338 are external output pins for die 304; pins 316 and 318 are internal output pins for die 306, and pins 328 and 330 are internal input pins for die 304; and pins 332 and 334 are internal output pins for die 304, and pins 320 and 322 are internal pins for die 306. The external pins electrically communicate with the outside world (e.g., signal paths outside the package), such as for example a logic analyzer, tester or ATE machine. Some or all of the internal pins are operatively connected to the outside world through multiplexers (e.g., 360-366) as explained herein. External pins do not have to be unique (or uniquely assigned) to any one die, but can be assigned to more than one die in test mode. Thus, external pins 308, 310, 312, 314 can be external input pins for either die 304 or die 306, depending on how the multiplexers (e.g., 352-358) are controlled, as explained further herein.

It should be understood that in an actual chip, many more pins are than shown in FIG. 3 can be present, and more dies than are shown in FIG. 3 may be connected through the bond pads and metal layer(s) of silicon interposer 302, with all dies housed within and all pins included as part of the SIP package 300.

Multiplexers, or muxes, shown as notched isosceles trapezoids in FIG. 3, are dispersed throughout the interposer 302. The muxes in the present invention could equivalently be realized by an number of different circuits, including but not limited to a circuit that acts or functions as a mux; a logic circuit with suitable Boolean and/or combinatorial logic (e.g., AND, OR, NOR and/or NAND gates); by a 3-state buffer, a pass-gate, or the like, as is evident to one skilled in the art. In one embodiment, the muxes (e.g., 352-358) may comprise or function as multiple-input, single-output switches to multiplex different pins of the dies in the SIP together, as explained further herein.

The muxes are controlled by outputs from a mode select (or mux control) circuit 340, shown conceptually in FIG. 3 as a 1-out-of-n decoder. The mode select circuit 340 outputs mux control signals on signal lines 342a-h to each mux. For example, an input mode (or control) signal "MODE" may put the MCM or SIP 300 into a particular operational mode, such as a test mode or normal operational mode, depending on the state or value of the control signal (e.g., MODE). Mode select circuit 340 receives the control signal (e.g., MODE) and transmits appropriate control (or input select) signals to muxes 352-366. By way of example and not limitation, mux control 340 may comprise a conventional n-to-$2^n$ type binary decoder, configured to control the input selection function of the muxes 352-366. This type of decoder (and/or functional equivalents thereof) are generally combinational or combinatorial circuits that convert n bits of binary information to a maximum of $2^n$ outputs, as is known to those skilled in the art. Thus a maximum of $2^n$ muxes may be controlled with n bits of information received by mode select circuit 340 (e.g., MODE). However, two or more muxes can receive the same mux control signal from mode select circuit 340.

During manufacturing, the logic of the muxes 352-366, mode select circuit 340, traces and the like are incorporated into the silicon interposer 302 rather than into the logic present in the dies 304, 306, or as separate circuit(s) apart from the silicon interposer 302 or dies 304, 306, due to the relative ease in manufacturing such logic as part of the silicon interposer. However, in principle, it is not impossible to manufacture the muxes 352-366, mode select circuit 340 and/or any other logic found in the silicon interposer 302 as part of the dies, or as separate circuits on their own substrate apart from the interposer 302, or in any combination thereof. In any event, the muxes 352-366 can logically be considered as part of the silicon interposer 302, as shown in FIG. 3. Suitable vertical vias and/or interconnects (e.g., such as ball bonds or bond wires) can connect the pins or terminals of the dies 304, 306 to the logic in the underlying silicon interposer 302.

The purpose of the muxes 352-366 is to allow as many external pins of the SIP, such as SIP input Pins 308, 310, 312, 314 and SIP output Pins 344, 346, 348, 350 in FIG. 3, to communicate with as many of the pins or terminals of the dies 304, 306 as possible without having to redesign the dies or the package to incorporate more pins. As shown in FIG. 3, the muxes 352-358 control the operative connection between the pins of the dies as follows. For die 304, the SIP input pin 308 inputs a signal (e.g., data) to die 304 and also mux 352. Upon selection by a mux control signal 342a from mode select circuit 340, the mux 352 can electrically connect the SIP input pin 308 to internal pin 320 of die 306. Upon a change of the control signal 342a to a different state, mux 352 can select internal output pin 332 of die 304 to communicate with internal pin 320 of die 306. Likewise, SIP input pin 310 can electrically connect to internal input pin 322 of die 306 upon a predetermined state of control signal 342b received at mux 354, and upon another predetermined state of control signal 342b, mux 354 can select internal output pin 334 of die 304 as an input to internal pin 322 of die 306.

The connections for the muxes and pins associated with die 306 of the SIP are similar in function to the preceding description of the muxes and pins of die 304. SIP input pin 312 inputs a signal (e.g., data or test data, depending on the operational mode of the SIP 300) to die 306 and also mux 356, which feeds into internal input pin 330 of die 304. Upon assertion of a predetermined state of control signal 342c from mode select circuit 340, the mux 356 can electrically connect the SIP input pin 312 for connection to internal input pin 330 of die 304. Upon a second predetermined state of control signal 342c, mux 356 can select internal output pin 318 of die 306 to communicate with internal input pin 330 of die 304. Likewise, SIP input pin 314, which provides an external input to die 306, can also electrically connect to internal input pin 328 of die 304 upon a first predetermined state of control signal 342d received at mux 358. Upon a second predetermined state of control signal 342d to mux 358, internal output pin 316 of die 306 can be selected for connection to internal input pin 328 of die 304. In typical operations, the control signals 342a-b at muxes 356-358 will have the same state, and the control signals 342c-d at muxes 352-354 will have the same state. The state of the control signals 342a-b and 342c-d will depend on whether die 304 is selected for testing, die 306 is selected for testing, or neither die 304 or 306 is selected for testing (e.g., the MCM is in normal operating mode).

The outputs from the dies 304, 306 can likewise be muxed so that the SIP output pins 344, 346, 348, and 350 can communicate with more internal pins than would be otherwise possible without the present invention. SIP output pin 344 receives either the internal output from pin 332 of die 304 or external output from pin 326 of die 306, depending on the state of the control signal 342e sent to mux 360 from mode select circuit 340. SIP output pin 346 receives either the internal output from pin 334 of die 304 or external output from pin 324 of die 306, depending on the state of the control signal 342f sent to mux 362. SIP output pin 348 receives either the external output from pin 336 of die 304 or internal output from pin 316 of die 306, depending on the state of the control signal 342g sent to mux 364. SIP output pin 350 receives either the external output from pin 338 of die 304 or internal output from pin 318 of die 306, depending on the state of the control signal 342h sent to mux 366. Muxes 360, 362, 364 and 366 can be termed output muxes and, under the control of the mode select circuit 340, receive outputs from pins of both die 304 and die 306. In typical operations, the control signals 342e-f at muxes 360-362 will have the same state, and the control signals 342g-h at muxes 364-366 will have the same state. The state of the control signals 342e-f and 342g-h will depend on whether die 304 is selected for testing, die 306 is selected for testing, or neither die 304 or 306 is selected for testing (e.g., the MCM is in normal operating mode). Typically, in the arrangement of FIG. 3, the control signals 342e-f at muxes 360-362 will have the same state as the control signals 342a-b at muxes 356-358, and the control signals 342g-h at muxes 364-366 will have the same state as the control signals 342c-d at muxes 352-354s.

Through the use of muxes 352-366 and the silicon interposer 302 as described in FIG. 3, the testing of dies 304-306 within a SIP package 300 can be done with existing pins (e.g., 308-314 and 344-350), obviating the need to redesign dies 304 and/or 306 or add additional package pins. As can be seen, the first and second dies 304, 306, and the test circuitry thereon, can be operatively connected to the silicon interposer 302 and the logic thereon through a plurality of I/O terminals (e.g., the plurality of pins 308-310, 312-314. 344-346, and 348-350 leading to and from the first die 304 and second die 306 in FIG. 3, which can be segregated by input terminals, output terminals, and/or terminals having a direct connection to the first die, the second die, and/or another die in normal operating mode, etc.). The first and second dies 304-306 receive external test signals through a first plurality of I/O terminals (e.g., 308-314) for communication with test circuitry on the first and second dies 304-306. The logic on the silicon interposer 302 may comprise a plurality of multiplexers (e.g., 352-366). The plurality of multiplexers may comprise a first subset (e.g., muxes 352, 354 in FIG. 3) connected to and/or receiving a first subset of external I/O terminals (e.g., pins 308, 310) and a first subset of internal I/O terminals (e.g., first die output pins 332 and 334 of first die 304), for selection of input signals to the another die (e.g., internal input terminals 320 and 322 of second die 306). Concomitantly, the plurality of multiplexers may comprise a second subset of multiplexers (e.g., muxes 356, 358 in FIG. 3) connected to and/or receiving a second subset of external I/O terminals (e.g., input pins 312 and 314) and a second subset of internal I/O terminals (e.g., output pins 316, 318 of die 306).

For outputting test data or results, the plurality of multiplexers may comprise an additional subset (for example, the subset of muxes 360-366 that receive one internal output signal from each die; e.g., mux 360 receiving an external signal from second die output pin 326, as well as an internal output signal from pin 332 of die 304). The additional subset of muxes can be segregated according to connection(s) to external output signal(s) from a particular die in normal operating mode. For example, the additional subset of muxes can include a third subset of muxes 360-362 that receive "normal mode" internal output signals from first die 304 (e.g., pins 332 and 334) and "normal mode" external signals from second die 306 (e.g., pins 324 and 326), and a fourth subset of muxes 364-366 that receive "normal mode" internal output signals from second die 306 (e.g., pins 316 and 318) and "normal mode" external signals from first die 304 (e.g., pins 336 and 338).

Further, since the silicon interposer 302 generally is manufactured using a process technology that has relatively large feature sizes (e.g., according to design rules having a relatively large minimum width or critical dimension), it can be relatively cheaply constructed using a relatively mature IC fabrication plant. The minimum feature size of the dies 304, 306 is advantageously smaller than the minimum feature size of the interposer 302. For example, the interposer 302 can be manufactured using a process technology having a minimum feature size of greater than or equal to 0.5 µm (micron) process technology, while the dies 304, 306 over the interposer 302 can be manufactured using a process technology of less than or equal to 0.35 µm (e.g. 130 nm, 90 nm or 65 nm process technology), although the interposer 302 can be manufactured advantageously using any technology having a larger minimum feature size than the dies 304, 306 (e.g., if the largest minimum feature size of dies 304, 306 is 130 nm, the interposer can be manufactured using technology having a minimum feature size of 180 nm or 250 nm).

In addition to the two dies 304, 306, the SIP 300 in FIG. 3 may include any number of additional dies laid out in the manner taught by the present invention, with muxes and connections on the underlying silicon interposer 302 connecting the additional die(s) to external I/O pins, as well as to neighboring dies. These dies may, without limitation, be laid out in any number of configurations within the SIP. Though the dies within the SIP are typically bonded to the interposer 302 via wire bonds or flip chip/ball bonds, the SIP or MCM package may independently have any kind of package configuration, without limitation (e.g., a QFP or BGA package, or the like). For example and without limitation, QFP surface mount dies are particularly well disposed for the dies of the present invention because one or more of the metal layers in the underlying silicon interposer 302 can connect a number of the QFP (wire-bonded) dies without the necessity of aligning the leads of the dies so that they do not cross, as is the case using prior technology.

While in the preferred embodiment of FIG. 3, a multiplexer was used to select an external output from two signal lines, in general, a mux may add some small delay to an output signal from the SIP or MCM. Thus, once testing has been concluded and the SIP is ready to be employed in the field, it may be possible to bypass the muxes shown with hardware (which may be programmable) that provides a means for bypassing the mux. By way of example and not limitation, an antifuse-based connection, transistor-based pass gate (which may have a fuse or other programming means coupled to the pass gate) or tri-state buffer can be activated to bypass the muxes shown in FIG. 3, once testing is completed, and thereby decrease any output delay (either internal, as for pins 316, 318, 332 and 334, or external, as for pins 324, 326, 336 and 338) associated with the multiplexers.

An Exemplary Method of Testing

It should be understood that testing of an IC includes many kinds of testing, including but not limited to DFT techniques including a full-scan, partial scan or boundary scan; testing of a building block IC core through a system IC functional test; a direct test application, which can access the core through I/O muxing; a test application to the core through (e.g., JTAG) or collar register; a BIST; DFT self-test with or without test patterns generated by the IC itself, and any other proprietary or industry standard procedure. The tests may act through a computer aided machine, Automatic Test Equipment (ATE), tester, or other electronic equipment that communicates with the external I/O pins of the SIP as taught herein, to observe, control or record test data to and from the SIP. The apparatus of the present invention are in no way limited by the type of test performed on the SIP.

Referring now to FIG. 4, an exemplary method 400 of testing a SIP in accordance with the present invention will now be described. The SIP package may be attached to a testing machine, for example an ATE, and a series of tests are initiated, which may be any number of tests involving input of a test pattern, test vectors or test signals to and/or from the SIP and then a comparison with the expected output by the SIP. Also, the SIP may employ self test circuitry that generates test data in response to certain external input signals. Any number of tests can be performed given the exemplary apparatus described in the present invention; the following example is by no means the only test or test procedure, nor is it meant to limit the claimed invention.

In step 410 of FIG. 4, the method is started by an appropriate or predetermined state of an external control signal such as the signal MODE in FIG. 3 (or combination of external control signals) that puts the SIP into test mode. In step 420 of the exemplary method of FIG. 4, the first chip in the SIP is selected for testing in response to an appropriate or predetermined state of another external control signal such as the signal CS[n] in FIG. 3 (or combination of external control signals). In step 430 of FIG. 4, a first chip is tested, preferably programmatically and/or automatically, and without the need for human input. The first chip may be tested using a plurality of tests, as described herein. If the first chip passes the test(s) (decision box 440), the method proceeds to step 450. If not (see the "No" branch from box 440), the method ends (result box 445).

The test of the first die is generally of one die inside the SIP, tested with the other dies in the SIP electrically isolated. In the FIG. 3 embodiment, where for simplicity two dies are shown in FIG. 3 (though many more dies may be present), consider a test of die 304 while die 306 is inactivated. Die 304 is put into test mode through the application of a suitable control signal and enabled (e.g. selected), and likewise die 306 is disabled. Consequently the pins available for testing die 304 include all four of the SIP external input pins 308, 310, 312, and 314, and the output pins include all four of the SIP external output pins 344, 346, 348, and 350. Since die 306 is inactive, muxes 356 and 358 would select input signals from external input pins 312 and 314 (carried on traces 357 and 359) as internal inputs 328 and 330 of die 304. Likewise, output muxes 360 and 362 would select signals from internal output pins 332 and 334 of die 304, while muxes 364 and 366 would select external outputs 336 and 338 from die 304 as shown. In this way, the method of testing can employ many more input and output pins than might otherwise be available without the present invention.

Likewise, die 306 could be tested while die 304 is inactivated. Suitable control signals would enable all four SIP input pins 308, 310, 312 and 314 to be used together with all four of the SIP output pins 344, 346, 348 and 350. Muxes 352, 354 would select a signal from SIP input pins 308 and 310 to be provided to internal input pins 320 and 322 of die 306. Output muxes 360 and 362 would select signals from output pins 324 and 326 of die 306, while muxes 364, 366 would select signals from internal output pins 316 and 318 of die 306 as shown. In this way all eight SIP I/O pins maybe employed to test a single die, double the case if such multiplexing was not present. In the case of more than two dies present in a SIP, suitable muxes and connections may be provided in the manner taught herein.

Referring back to FIG. 4, in step 450, the next chip in the SIP is selected, and in step 460, the next chip is tested similarly or identically to the first chip, as shown in step 430 and described herein. If the next chip does not pass the test(s) (see the "No" branch from box 470), the method ends (result box 475). However, if the next chip passes the test(s) (decision box 470), the method then determines whether all of the chips in the SIP have been tested (decision box 480). If not, the method selects the next chip (step 450) and tests it (step 460). If all of the chips have been tested and all have passed, then the method ends (result box 485)

An Exemplary Method of Manufacturing

The method of fabricating the present SIP or MCM includes fabricating the dies, such as dies 304 and 306, separately from the silicon interposer 302. The dies in general are manufactured with a process technology that produces a minimum feature size smaller than the process technology that produces the minimum feature size of the silicon interposer. For example, the dies may be manufactured with a 65, 90 or 130 nm process technology, while the silicon interposer is manufactured with a 0.35 μm, 0.5 μm or larger process technology.

Logic, such as the muxes, traces and mode select circuit of FIG. 3, is made using the silicon substrate and a polysilicon layer of the silicon interposer 302 for logic transistors, and one or more metallization and intermetal and/or metal-to-poly contact layers, using conventional wafer manufacturing process technology, including but not limited to the steps of photolithography, doping, deposition and etching, as are known per se in the art.

After the dies and silicon interposer are made, they are connected together by conventional mounting and bonding so that the pins or I/O terminals of the dies 304, 306 in FIG. 3 electrically communicate with the pins or I/O terminals of the underlying silicon interposer 302. In one embodiment, the surface of a die not containing exposed bond pads is mounted onto the surface of the underlying interposer 302 having exposed bond pads using a conventional adhesive, then one or more bond pads of the die are wire-bonded to one or more of the bond pads on the interposer 302. This wire-bonding step is repeated until all of the desired electrical connections between the die and the interposer 302 are made. Alternatively, conventional solder balls (which may include fine-pitched solder balls) are formed on the exposed bond pads of a die, and the balls are bonded to a subset of the exposed bond pads of the underlying interposer 302 (which bond pads may have a bumping, conductive adhesive, and/or bond-forming material thereon) using conventional ball-bonding technology. Thereafter, mounted and bonded interposer and dies are suitably packaged, such as in a conventional QFP or BGA packaging as is known in the art to be applicable to SIP or MCM devices. The die-interposer assembly and packaging process may further include backside preparation of a wafer (e.g., grinding), separation of the die from the wafer (e.g., sawing the wafer along scribe lines to obtain individual dies), attaching the die onto the interposer (e.g., with a gold-silicon eutectic layer or an epoxy adhesive material), package sealing (such as epoxy underfilling), plating, trimming and marking of outer package and/or leads thereof, and any final testing, including burn-in tests of the packaged product.

Exemplary Systems Using the Present MCM

In a further aspect of the invention, a system may comprise the present MCM. Various exemplary implementations of the present invention are shown in FIGS. 5A-5G.

Figure 5A:
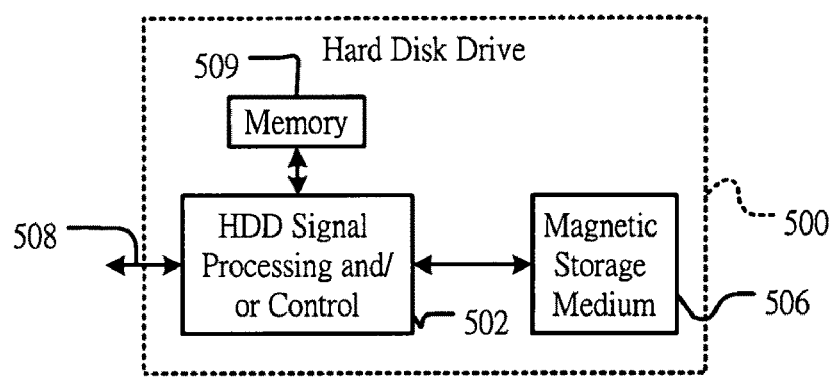
FIGS. 5A-5G are diagrams showing exemplary systems in which the present invention may be used.

Referring now to FIG. 5A, the present invention can be implemented in a hard disk drive (HDD) 500. The present MCM may include multiple die that individually implement a memory function 509, or either or both signal processing and/or control circuits, which are generally identified in FIG. 5A at 502. In some implementations, the signal processing and/or control circuit 502 and/or other circuits (not shown) in the HDD 500 may process data, perform coding and/or encryption, perform calculations, and/or format data that is output to and/or received from a magnetic storage medium 506.

The HDD 500 may communicate with a host device such as a computer, mobile computing devices such as personal digital assistants, cellular phones, media or MP3 players and the like, and/or other devices via one or more wired or wireless communication links 508. The HDD 500 may include or be connected to memory 509 such as dynamic random access memory (DRAM), low latency nonvolatile memory such as flash memory, read only memory (ROM) and/or other suitable electronic data storage.

Figure 5B:
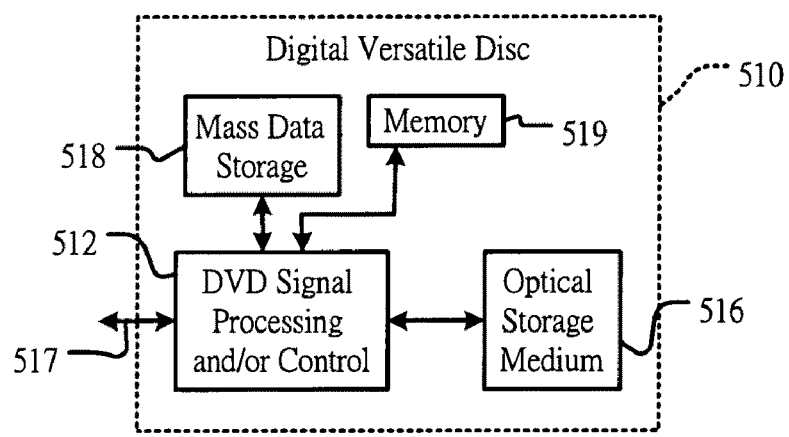

Referring now to FIG. 5B, the present invention can be implemented in a digital versatile disc (DVD) drive 510. The present MCM may include multiple die that individually implement a memory function 519, either or both signal processing and/or control circuits, which are generally identified in FIG. 5B at 512, or mass data storage 518 for the DVD drive 510. The signal processing and/or control circuit 512 and/or other circuits (not shown) in the DVD 510 may process data, perform coding and/or encryption, perform calculations, and/or format data that is read from and/or data written to an optical storage medium 516. In some implementations, the signal processing and/or control circuit 512 and/or other circuits (not shown) in the DVD 510 can also perform other functions such as encoding and/or decoding and/or any other signal processing functions associated with a DVD drive.

The DVD drive 510 may communicate with an output device (not shown) such as a computer, television or other device via one or more wired or wireless communication links 517. The DVD 510 may communicate with mass data storage 518 that stores data in a nonvolatile manner. The mass data storage 518 may include a plurality of (e.g., from 2 to 16) flash memory chips or a hard disk drive (HDD). The HDD may have the configuration shown in FIG. 5A. The HDD may be a mini HDD that includes one or more platters having a diameter that is smaller than approximately 1.8". The DVD 510 may be connected to memory 519 such as RAM, ROM, low latency nonvolatile memory such as flash memory and/or other suitable electronic data storage.

Figure 5C:
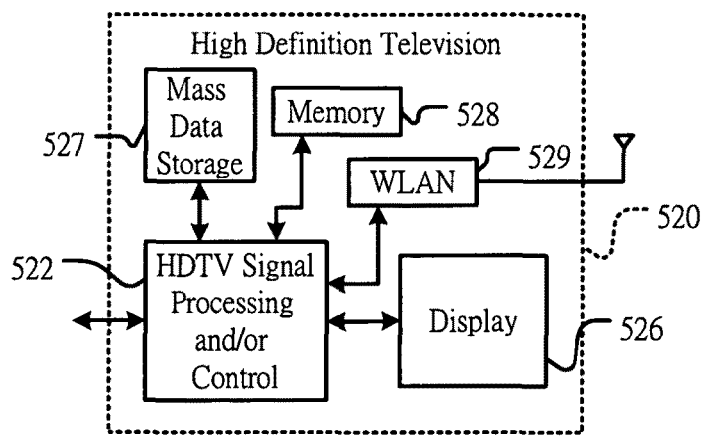

Referring now to FIG. 5C, the present invention can be implemented in a high definition television (HDTV) 520. The present MCM may include multiple die that individually implement a memory function 528, or either or both signal processing and/or control circuits, which are generally identified in FIG. 5C at 522, a WLAN interface 529, and/or mass data storage 527 for the HDTV 520. The HDTV 520 receives HDTV input signals in either a wired or wireless format and generates HDTV output signals for a display 526. In some implementations, signal processing circuit and/or control circuit 522 and/or other circuits (not shown) of the HDTV 520 may process data, perform coding and/or encryption, perform calculations, format data and/or perform any other type of HDTV processing that may be required.

The HDTV 520 may communicate with mass data storage 527 that stores data in a nonvolatile manner such as flash memory, optical and/or magnetic storage devices. At least one HDD may have the configuration shown in FIG. 5A and/or at least one DVD may have the configuration shown in FIG. 5B. The HDD may be a mini HDD that includes one or more platters having a diameter that is smaller than approximately 1.8". The HDTV 520 may be connected to memory 528 such as RAM, ROM, low latency nonvolatile memory such as flash memory and/or other suitable electronic data storage. The HDTV 520 also may support connections with a WLAN via a WLAN network interface 529.

Figure 5D:
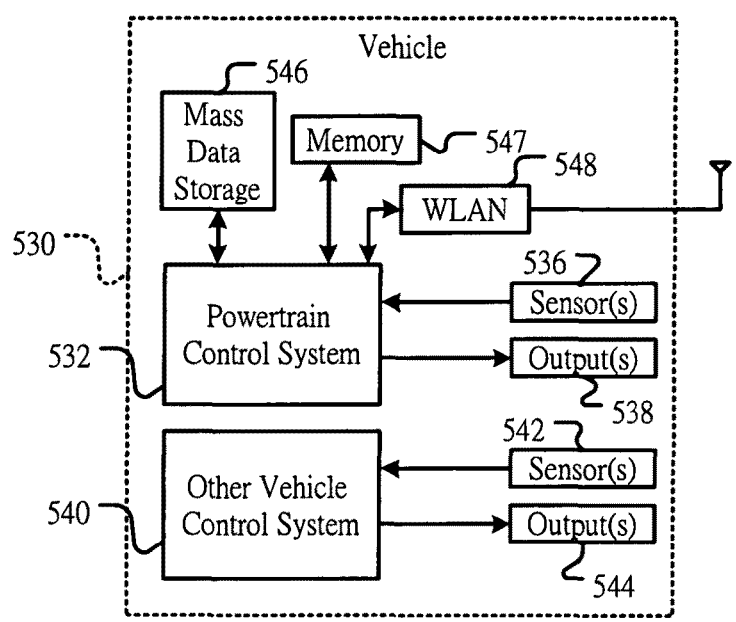

Referring now to FIG. 5D, the present invention can be implemented in a control system of a vehicle 530, a WLAN interface 548 and/or mass data storage 546 of the vehicle control system. The present MCM may include multiple die that individually implement a memory function 547, either or both signal processing and/or control circuits, which are generally identified in FIG. 5D at 532 and 540, a WLAN interface 548, and/or mass data storage 546 for the vehicle 530. In some implementations, the system includes a powertrain control system 532 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present system may also include one or more other control systems 540 of the vehicle 530. The control system 540 may likewise receive signals from input sensors 542 and/or output control signals to one or more output devices 544. In some implementations, the control system 540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 532 may communicate with mass data storage 546 that stores data in a nonvolatile manner. The mass data storage 546 may include optical and/or magnetic storage devices (for example, hard disk drives [HDDs] and/or DVDs). At least one HDD may have the configuration shown in FIG. 5A and/or at least one DVD may have the configuration shown in FIG. 5B. The HDD may be a mini HDD that includes one or more platters having a diameter that is smaller than approximately 1.8". The powertrain control system 532 may be connected to memory 547 such as RAM, ROM, low latency nonvolatile memory such as flash memory and/or other suitable electronic data storage. The powertrain control system 532 also may support connections with a WLAN via a WLAN network interface 548. The control system 540 may also include mass data storage, memory and/or a WLAN interface (all not shown, but which can be similar or identical to powertrain control system 532).

Figure 5E:
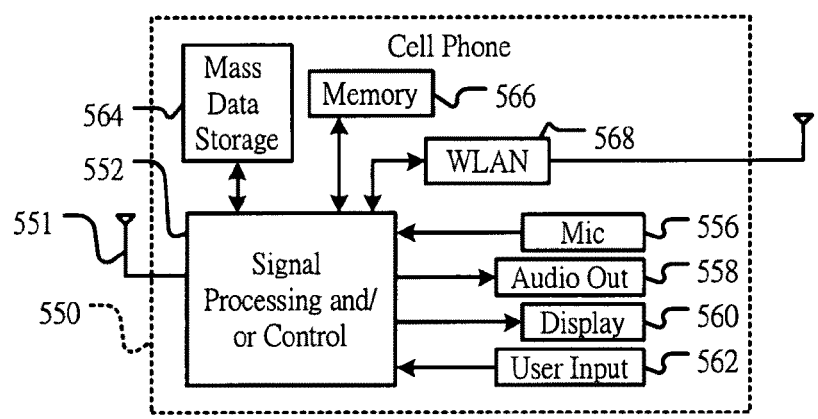

Referring now to FIG. 5E, the present invention can be implemented in a cellular phone 550 that may include a cellular antenna 551. The present MCM may include multiple die that individually implement a memory function 566, either or both signal processing and/or control circuits, which are generally identified in FIG. 5E at 552, a WLAN interface 568, and/or mass data storage 564 for the cellular phone 550. In some implementations, the cellular phone 550 includes a microphone 556, an audio output 558 such as a speaker and/or audio output jack, a display 560 and/or an input device 562 such as a keypad, pointing device, voice actuation and/or other input device. The signal processing and/or control circuits 552 and/or other circuits (not shown) in the cellular phone 550 may process data, perform coding and/or encryption, perform calculations, format data and/or perform other cellular phone functions.

The cellular phone 550 may communicate with mass data storage 564 that stores data in a nonvolatile manner such as optical and/or magnetic storage devices (for example, hard disk drives [HDDs] and/or DVDs). At least one HDD may have the configuration shown in FIG. 5A and/or at least one DVD may have the configuration shown in FIG. 5B. The HDD may be a mini HDD that includes one or more platters having a diameter that is smaller than approximately 1.8". The cellular phone 550 may be connected to memory 566 such as RAM, ROM, low latency nonvolatile memory such as flash memory and/or other suitable electronic data storage. The cellular phone 550 also may support connections with a WLAN via a WLAN network interface 568.

Figure 5F:
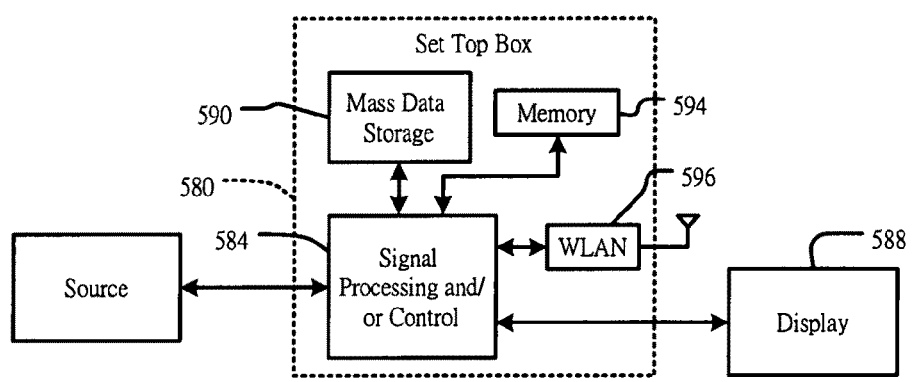

Referring now to FIG. 5F, the present invention can be implemented in a set top box 580. The present MCM may include multiple die that individually implement a memory function 594, either or both signal processing and/or control circuits, which are generally identified in FIG. 5F at 584, a WLAN interface 596, and/or mass data storage 590 for the set top box 580. The set top box 580 receives signals from a source such as a broadband source and outputs standard and/or or high definition audio/video signals suitable for a display 588 such as a television and/or monitor and/or other video and/or audio output devices. The signal processing and/or control circuits 584 and/or other circuits (not shown) of the set top box 580 may process data, perform coding and/or encryption, perform calculations, format data and/or perform any other set top box function.

The set top box 580 may communicate with mass data storage 590 that stores data in a nonvolatile manner. The mass data storage 590 may include optical and/or magnetic storage devices (for example, hard disk drives [HDDs] and/or DVDs). At least one HDD may have the configuration shown in FIG. 5A and/or at least one DVD may have the configuration shown in FIG. 5B. The HDD may be a mini HDD that includes one or more platters having a diameter that is smaller than approximately 1.8". The set top box 580 may be connected to memory 594 such as RAM, ROM, low latency nonvolatile memory such as flash memory and/or other suitable electronic data storage. The set top box 580 also may support connections with a WLAN via a WLAN network interface 596.

Figure 5G:
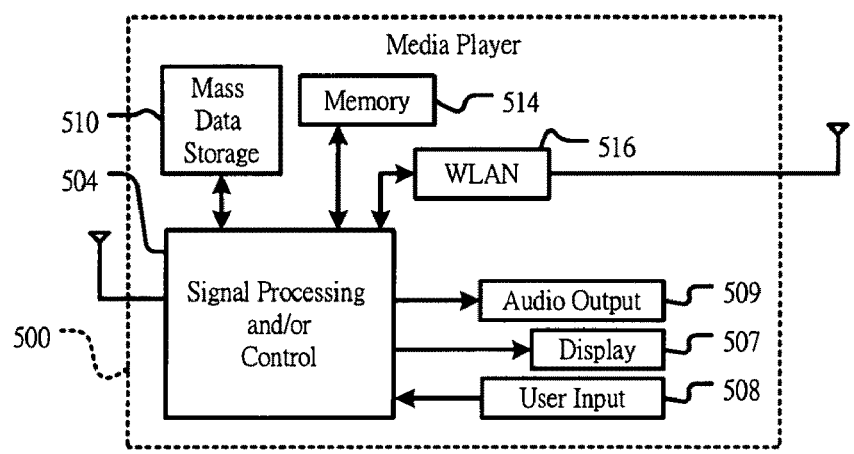

Referring now to FIG. 5G, the present invention can be implemented in a media player 600. The present MCM may include multiple die that individually implement a memory function 614, either or both signal processing and/or control circuits, which are generally identified in FIG. 5G at 604, a WLAN interface 616, and/or mass data storage 610 for the media player 600. In some implementations, the media player 600 includes a display 607 and/or a user input 608 such as a keypad, touchpad and the like. In some implementations, the media player 600 may employ a graphical user interface (GUI) that typically employs menus, drop down menus, icons and/or a point-and-click interface via the display 607 and/or user input 608. The media player 600 further includes an audio output 609 such as a speaker and/or audio output jack. The signal processing and/or control circuits 604 and/or other circuits (not shown) of the media player 600 may process data, perform coding and/or encryption, perform calculations, format data and/or perform any other media player function.

The media player 600 may communicate with mass data storage 610 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices (for example, hard disk drives [HDDs] and/or DVDs). At least one HDD may have the configuration shown in FIG. 5A and/or at least one DVD may have the configuration shown in FIG. 5B. The HDD may be a mini HDD that includes one or more platters having a diameter that is smaller than approximately 1.8". The media player 600 may be connected to memory 614 such as RAM, ROM, low latency nonvolatile memory such as flash memory and/or other suitable electronic data storage. The media player 600 also may support connections with a WLAN via a WLAN network interface 616. Still other implementations in addition to those described above are contemplated.

CONCLUSION/SUMMARY

Thus, the present invention discloses a circuit apparatus and method for testing integrated circuits, specifically dies housed in a SIP, which may include various dies within it, in an economical manner. Internal pins may be addressed easily through external pins by the use of a silicon interposer connecting dies in the SIP, with muxes to multiplex external and internal pins of the dies. The use of a relatively simple to construct silicon interposer allows older IC fabrication plants to be employed to construct the present invention. Further, use of the present invention allows SIP packages to be tested for faults without the necessity of redesigning the included dies or adding additional pins to the SIP.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A multichip module, comprising:
a silicon interposer having logic, said logic configured to
(i) receive one or more external test signals and one or more output signals from each die of a plurality of dies,
(ii) select a test input signal for said each die from said one or more external test signals and said one or more output signals of another die of said plurality of dies, and
(iii) transmit one or more test result signals from any one of said plurality of dies for external communication;
a first die of said plurality of dies, operatively connected to said silicon interposer and a second die of said plurality of dies, said first die having a first plurality of input/output (I/O) terminals configured to communicate with said logic, and having test circuitry for testing said first die with at least a first one of said test input signals;
said second die operatively connected to said silicon interposer and said first die, said second die having a second plurality of input/output (I/O) terminals configured to communicate with said logic, and having test circuitry for testing said second die with at least a second one of said test input signals; and
a package, said package (i) housing each of said first die and said second die and (ii) covering said silicon interposer;
wherein said logic comprises a plurality of multiplexers, wherein
at least a first subset of said multiplexers receive (i) at least one of said one or more output signals from a first subset of said first plurality of I/O terminals and (ii) at least one first external input signal;
a second subset of said multiplexers receive (i) at least one of said one or more output signals from a first subset of said second plurality of I/O terminals and (ii) at least one second external input signal; and
a third subset of said multiplexers receive at least a first one of said one or more test result signals from a second subset of said first plurality of I/O terminals and at least a second one of said one or more test result signals from a second subset of said second plurality of I/O terminals.

2. The multichip module according to claim 1, wherein said logic further comprises a mode select circuit configured to control said plurality of multiplexers.

3. The multichip module according to claim 2, wherein said mode select circuit receives a test mode signal that causes one of said first and second subsets of multiplexers to select one or more external inputs on said interposer.

4. The multichip module according to claim 2, wherein said test mode signal causes said third subset of said multiplexers to select an outputs from one of said first die and said second die as one of said one or more test result signals.

5. The multichip module according to claim 2, wherein said mode select circuit receives one or more chip select signals configured to select said first die or said second die for testing.

6. The multichip module according to claim 5, wherein a first predetermined state of said one or more chip select signals configures said first subset of said multiplexers to select said at least one first external input signal, and said third subset of said multiplexers to select at least one of said one or more test result signals from said second subset of said second plurality of I/O terminals.

7. The multichip module according to claim 6, wherein a second predetermined state of said one or more chip select signals configures said second subset of said multiplexers to select said at least one second external input signal, and said third subset of said multiplexers to select at least one of said one or more test result signals from said second subset of said first plurality of I/O terminals.

8. The multichip module according to claim 2, wherein said mode select circuit comprises an n-to-2n type binary decoder.

9. The multichip module according to claim 3, wherein said test mode signal puts the multichip module into test mode or normal operation mode.

10. The multichip module according to claim 3, wherein said test mode signal selects a single die of said plurality of dies for testing while electrically isolating the other dies of said plurality of dies.

11. The multichip module according to claim 1, wherein said silicon interposer has one or more metal layers operatively connecting pins of said I/O terminals to said multiplexers.

12. The multichip module according to claim 1, comprising a first plurality of wire bonds or ball bonds between said first die and said interposer.

13. The multichip module according to claim 12, comprising a second plurality of wire bonds or ball bonds between said second die and said interposer.

14. The multichip module according to claim 13, wherein said wire bonds or ball bonds are electrically connected to said I/O terminals.

15. The multichip module according to claim 1, wherein each of said first and second dies have a minimum feature size that is smaller than a minimum feature size of said interposer.

16. The multichip module according to claim 15, wherein (i) said first die and second die have a said minimum feature size of less than or equal to 0.35 µm and (ii) said interposer has a said minimum feature size of greater than or equal to 0.50 µm.

17. The multichip module according to claim 1, wherein said package comprises a Ball Grid Array (BGA) or a Quad Flat Pack (QFP) configuration.

18. The multichip module according to claim 1, wherein said first subset of said multiplexers comprises a first multiplexer and a second multiplexer, each of said first and second multiplexers configured to select between one of said one or more external test signals and one of said one or more output signals of said another die.

19. The multichip module according to claim 1, wherein said second subset of said multiplexers comprises a first multiplexer and a second multiplexer, each of said first and second multiplexers configured to select between one of said one or more external test signals and one of said one or more output signals of said another die.

20. The multichip module according to claim 1, wherein said third subset of said multiplexers comprises a first multiplexer, a second multiplexer, a third multiplexer and a fourth multiplexer, each of said first, second, third, and fourth multiplexers configured to select between one of said one or more output signals from said first die and one of said one or more output signals from said second die.

21. The multichip module according to claim 1, wherein said logic comprises a logic circuit with Boolean or combinatorial logic.

22. The multichip module according to claim 1, wherein said test circuitry for said first die and said second die is enabled for scan chain testing.

23. The multichip module according to claim 1, wherein the said test circuitry is selected from the group consisting of full-scan, partial scan, IC functional, direct, BIST, or DFT self-test circuitry.

* * * * *